(12) United States Patent
Kutzner et al.

(10) Patent No.: US 8,508,214 B2
(45) Date of Patent: Aug. 13, 2013

(54) ELECTRONIC CIRCUIT DEVICE FOR SENSING A DETECTION ELEMENT CURRENT AND/OR A TEMPERATURE IN SAID DETECTION ELEMENT

(75) Inventors: Michael Kutzner, Sulzbach (DE); Tobias Unger, Bischofsheim (DE)

(73) Assignee: Continental Teves AG & Co oHG (DE)

( * ) Notice: Subject to any disclaimer, the term of this patent is extended or adjusted under 35 U.S.C. 154(b) by 456 days.

(21) Appl. No.: 12/863,833

(22) PCT Filed: Jan. 23, 2009

(86) PCT No.: PCT/EP2009/050772
§ 371 (c)(1),
(2), (4) Date: Jul. 21, 2010

(87) PCT Pub. No.: WO2009/092788
PCT Pub. Date: Jul. 30, 2009

(65) Prior Publication Data
US 2010/0295539 A1  Nov. 25, 2010

(30) Foreign Application Priority Data

Jan. 25, 2008 (DE) .......................... 10 2008 006 252
Nov. 3, 2008 (DE) .......................... 10 2008 055 696

(51) Int. Cl.
*G01R 21/00* (2006.01)
(52) U.S. Cl.
USPC ........................................................ 324/105

(58) Field of Classification Search
USPC ....... 324/105, 762.01–762.1, 750.3; 307/9.1; 257/48; 438/14–18
See application file for complete search history.

(56) References Cited

U.S. PATENT DOCUMENTS

| | | | |
|---|---|---|---|
| 4,978,865 A | | 12/1990 | Hartmann et al. |
| 5,361,033 A | * | 11/1994 | Houston ........................ 324/537 |
| 5,815,027 A | | 9/1998 | Tihanyi et al. |
| 6,392,392 B1 | * | 5/2002 | Nakahara ...................... 323/312 |
| 2004/0041573 A1 | | 3/2004 | Klemm et al. |
| 2006/0250153 A1 | | 11/2006 | Colbeck |

FOREIGN PATENT DOCUMENTS

| | | |
|---|---|---|
| DE | 3824526 A1 | 1/1990 |
| DE | 4410705 A1 | 10/1995 |
| DE | 19520735 A1 | 12/1996 |
| DE | 10029446 A1 | 1/2002 |

* cited by examiner

Primary Examiner — Tung X Nguyen
(74) Attorney, Agent, or Firm — RatnerPrestia

(57) ABSTRACT

An electronic switching device and method for the detection of a detection element stream through a detection element and/or a temperature in said detection element. A first connection of the detection element is connected to a first transistor element and a second connection of the detection element is connected to a second transistor element. The base connections of the first and second transistor element are directly or indirectly connected to one another and the second transistor element (Q2) provides and/or modulates an electrical evaluation signal. The signal value of the electrical evaluation signal is directly or indirectly dependent on at least the detection element stream and/or the temperature in the detection element.

18 Claims, 4 Drawing Sheets

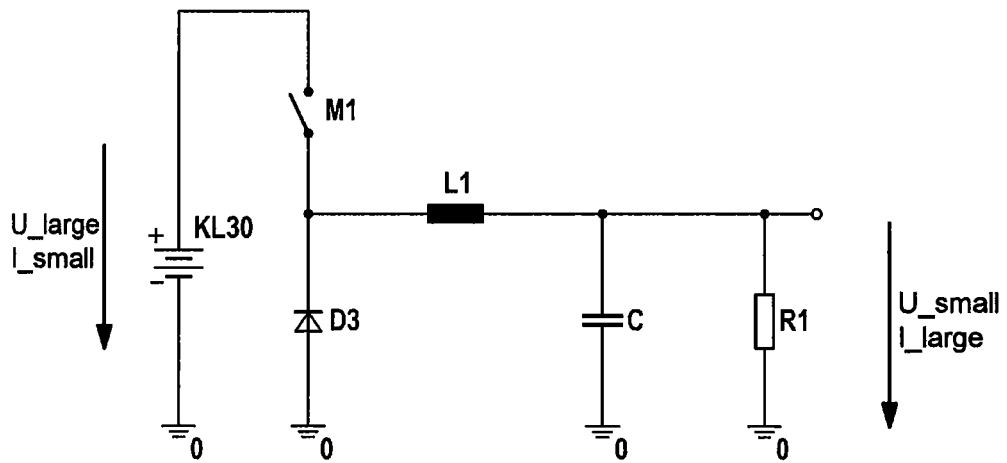
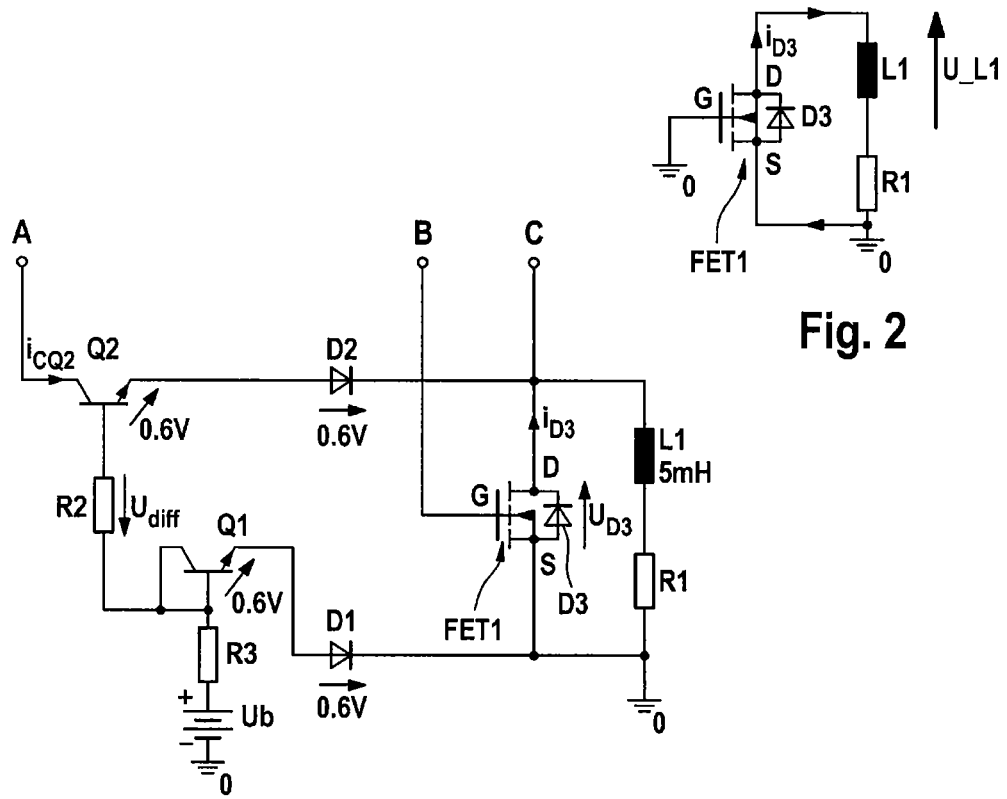
Fig. 1
Fig. 2
Fig. 3

ELECTRONIC CIRCUIT DEVICE FOR SENSING A DETECTION ELEMENT CURRENT AND/OR A TEMPERATURE IN SAID DETECTION ELEMENT

CROSS REFERENCE TO RELATED APPLICATIONS

This application is the U.S. national phase application of PCT International Phase Application No. PCT/EP2009/050772, filed Jan. 23, 2009, which claims priority to German Patent Application No. 10 2008 006 252.9, filed Jan. 25, 2008, and German Patent Application No. 10 2008 055 696.3, filed Nov. 3, 2008, the contents of such applications are incorporated by reference herein.

FIELD OF THE INVENTION

The invention relates to an electronic circuit device, a method for current sensing, a method for temperature sensing and the use of the circuit device in motor vehicles.

BACKGROUND OF THE INVENTION

In the field of electronic brake controllers, inductive loads, such as valve coils or pump motors, are actuated in clocked fashion (PWM actuation) by means of a semiconductor switch element. An appropriate load actuation circuit needs to be set up such that the freewheeling current produced in the recirculation phase can flow on the basis of the load inductance. To this end, the semiconductor switch element has a freewheeling diode. It has been found to be advantageous for the semiconductor switch element to be switched to low impedance during the recirculation phase at least if a defined freewheeling current is exceeded, as a result of which the electrical switching losses in the PWM can be kept relatively low.

In order to be able to implement an active freewheeling element of this kind, it is necessary to determine the current in the freewheeling diode that implements the freewheeling element or in a detection element.

Furthermore, it is frequently desirable to sense the temperature in a detection element, particularly in a freewheeling diode, of an electronic circuit.

SUMMARY OF THE INVENTION

An object of at least one aspect of the present invention is to propose an electronic circuit device for sensing a detection element current through a detection element and/or a temperature in said detection element, the intention being for this to be relatively inexpensive.

The invention achieves said object by means of the electronic circuit device and the methods described herein.

The first and second transistor elements are alternatively in the form of bipolar transistor elements or in the form of FETs, particularly JFETs.

The sensing of a detection element current through the detection element is preferably understood to mean measurement of the detection element current, particularly when the temperature of the detection element is essentially known, and/or the sensing of when a defined current threshold value is exceeded by the detection element current.

The sensing of a temperature in the detection element is preferably understood to mean measurement of the temperature, particularly when the detection element current is essentially known, in the detection element and/or the sensing of when a defined temperature threshold is exceeded in the detection element.

A current/voltage characteristic is preferably also understood to mean a characteristic or multitude of characteristics which shows the temperature dependency of current and/or voltage and accordingly comprises a piece of temperature dependency information.

The electronic circuit device preferably provides the electrical evaluation signal as an "amplified" measurement current for a voltage across the detection element.

The detection element is preferably a semiconductor component, particularly the bulk diode or body diode of an FET.

Preferably, the detection element is in the form of a freewheeling diode which is arranged in a common circuit mesh with an inductive load, and said inductive load is particularly in the form of a valve coil and/or a motor, particularly preferably in the form of a pump motor.

The detection element is alternatively preferably in the form of a polarity reversal protection diode. In this case, particularly the temperature thereof and/or a possible short-circuit current is intended to be sensed by means of the circuit device according to aspects of the invention.

The detection element is preferably in the form of an active freewheeling element, particularly for an inductive load.

The first and second transistor elements preferably each have their emitter connection and source connection connected to the detection element, and the electrical evaluation signal is particularly an evaluation current, the amperage of which is obtained at least from a portion of the detection element current which is amplified by the second transistor element. In this case, the evaluation current is particularly preferably the collector current or drain current of the second transistor element.

It is preferred for the voltage drop across the detection element to be mirrored on a mirror resistor by means of the first and second transistor elements, so that said mirror resistor essentially has the same voltage magnitude across it as the detection element.

The first and second transistor elements are preferably each connected to the detection element by means of a diode element for decoupling, wherein said diode elements are in blocking form or arrangement particularly in each case in the direction from the detection element to the first and second transistor elements. Said diode elements are particularly preferably in the form of a diode or in the form of a diode path of a transistor element, wherein the diode elements are quite particularly preferably coupled to one another thermally.

The detection element is preferably in the form of a semiconductor switch element or part of a semiconductor switch element which, in particular, is in the form of a driver element of a recirculation path in an electronic, pulse-width-modulated valve actuation circuit.

The evaluation signal is preferably supplied to an actuation circuit which actuates the semiconductor switch element. The actuation circuit particularly comprises a flipflop, particularly preferably an RS-type flip-flop.

It is preferred for the semiconductor switch element actively carrying a freewheeling current to be actuated by the actuation circuit on the basis of the evaluation signal and/or a load current through the inductive load. In this case, the semiconductor switch element is turned on particularly when a defined detection element current and/or a defined load current through the inductive load is exceeded.

The actuation circuit expediently comprises a hold circuit and a reset circuit. In this case, the hold circuit applies particularly at least a portion of the evaluation signal to a control connection or the base or gate connection of the semiconductor switch element directly or indirectly and turns on the latter when a defined detection element current is exceeded. In addition, said turned-on state is preserved by an electronic self-hold circuit after the defined detection element current has been exceeded. The reset circuit is particularly preferably in a form such that it can terminate said state preservation by quite particularly preferably connecting at least a portion of the self-hold circuit to ground and/or applying a ground potential and/or a defined potential to the control connection of the semiconductor switch element, as a result of which the latter is turned off.

The actuation circuit is expediently actuated by a PWM switch-on signal and/or a PWM switch-off signal or a PWM control signal on the basis of PWM regulation, wherein particularly the reset circuit is actuated by the PWM switch-on signal, as a result of which the hold state of the hold circuit is terminated, particularly preferably shortly before the start of a switch-on phase or shortly before the end of a recirculation phase. This prevents a possible short circuit through the semiconductor switch element at the start of a switch-on phase if a defined detection element current or freewheeling current was exceeded in the previous recirculation phase and therefore the semiconductor switch element has been turned on by the actuation circuit for the purpose of active freewheeling.

The inductive load is preferably actuated via a current regulator, wherein the load current is lowered to a voltage potential below the supply voltage of the load by means of a step-down controller.

The step-down controller preferably comprises a DC/DC converter which uses a clocked stage to charge an energy store, particularly a coil or a capacitor.

The first and second transistor elements are preferably coupled to one another thermally.

The electronic circuit device is preferably at least partly in the form of a discrete circuit or alternatively preferably at least partly in the form of an integrated circuit.

The invention also relates to the use of the electronic circuit device in motor vehicles, such as in an electronic brake controller or a chassis controller or a controller for active or passive safety systems or in a combination of said controllers.

BRIEF DESCRIPTION OF THE DRAWINGS

The invention is best understood from the following detailed description when read in connection with the accompanying drawings. Included in the drawings are the following figures:

Schematically,

FIG. 1 shows a clocked step-down controller,

FIG. 2 shows a passive freewheeling element with a MOS-FET,

FIG. 3 shows an exemplary circuit device for sensing a freewheeling current,

DETAILED DESCRIPTION OF THE INVENTION

Figure 4:
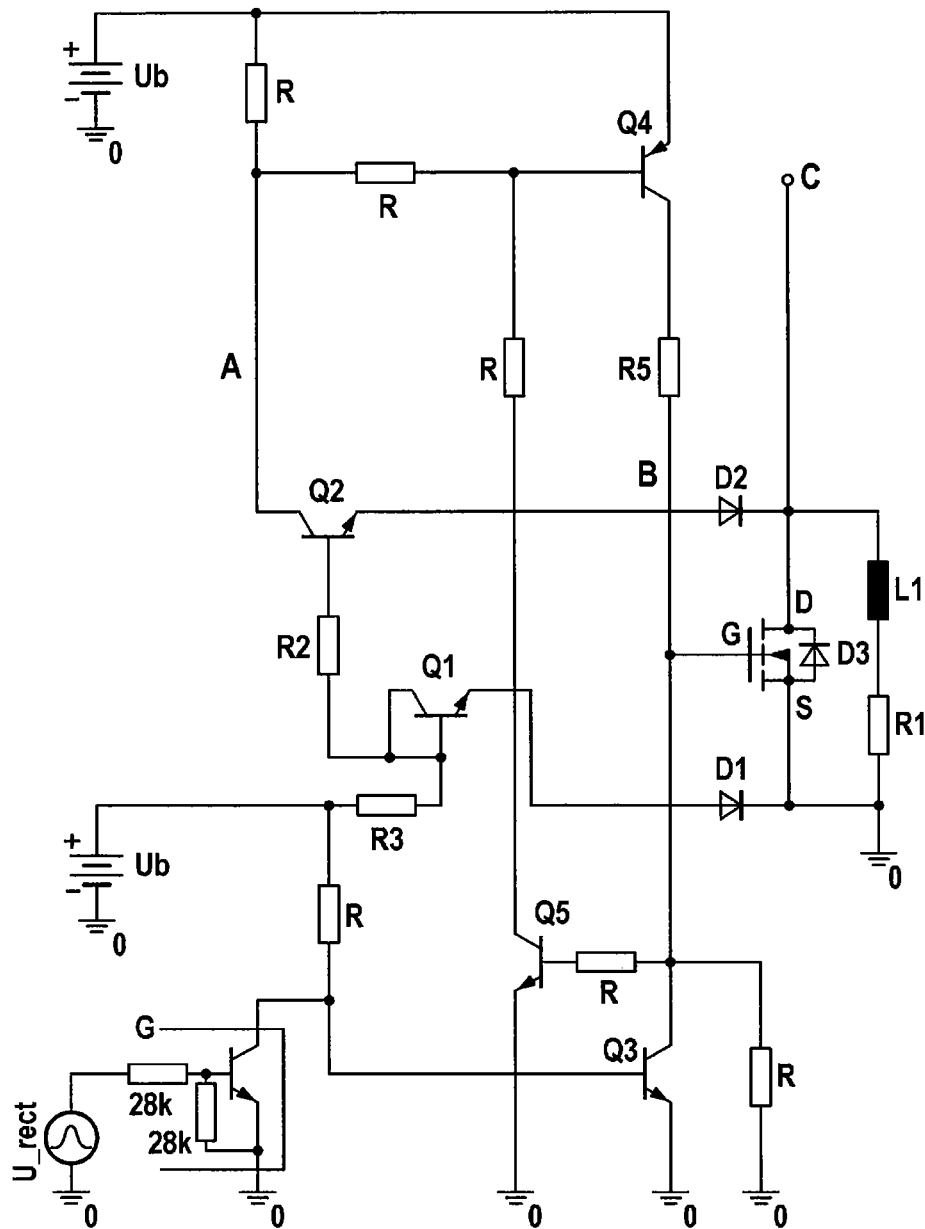
FIG. 4 shows an exemplary embodiment of the circuit device with an actuation circuit.

The exemplary step-down controller in FIG. 1 comprises a clocked DC/DC step-down converter with a coil L1 as energy store or inductive load. The clocking is performed using a semiconductor switch M1, which is switched on and switched off alternately. Switching off and switching on the switch M1 and a suitable choice of switching frequency charge the coil L1 to a desired voltage. The coil is discharged through a connected load R1 when the switch M1 is off as a result of the coil L1 being discharged, with the current flowing via the freewheeling diode D3. Arranged downstream of the coil, in parallel with the load, there is a capacitor C for smoothing the periodic coil current in a similar manner to a 2nd-order low-pass filter.

In the exemplary circuit arrangement shown in FIG. 2, a freewheeling current from the inductive load L1 flows through the resistive load R1 and through the semiconductor switch element FET1, comprising the bulk diode or freewheeling diode D3, from the source connection S to the drain connection D. The gate connection G is connected to a reference-ground potential (GND, "0"). The illustrated circuit operates more or less automatically, since the voltage across the load L1, R1 is high enough in comparison with the reference-ground potential in order to turn on the bulk diode D3 and thus allow freewheeling. The circuit arrangement shown in FIG. 2 has a few drawbacks, however. For example, the voltage drop across the detection element D3 is still very high.

FIG. 3 illustrates an exemplary embodiment of the electronic circuit device, which, in line with the example, is used to sense a freewheeling current or detection current $i_{D3}$ through the detection element D3. The detection element D3 is in the form of a bulk diode or freewheeling diode of the semiconductor switch element FET1 in the form of a MOS-FET. FET1 is used as a power driver for the recirculation path of a pulse-width-modulated valve actuation circuit, with inductive load L1 and resistive load R1 schematically depicting the electrical response of the valve. In a switch-on phase of the PWM, FET1 is off and terminal C and the ground connection "0" have a supply voltage applied between them which is used to operate the valve L1, R1. In a recirculation phase of the PWM, the supply voltage is not applied to terminal C and the energy stored in inductive load L1 drives a current through the circuit mesh L1, R1, FET1 in the forward direction of the freewheeling diode or the detection element D3. In line with the example, an active freewheeling element is implemented by virtue of the detection element current $i_{D3}$ being sensed and, when a defined threshold current is exceeded, the semiconductor switch element FET1 being turned on by means of a defined potential on terminal B, which is connected to the gate connection of FET1. For the purpose of sensing the detection element current $i_{D3}$, the exemplary embodiment of the circuit device has a first and a second transistor element Q1 and Q2, which are respectively in the form of bipolar transistors, are thermally coupled to one another and each have their emitter connection connected to the detection element D3. The control and base connections of these transistor elements Q1 and Q2 are coupled to one another via the mirror resistor R2. The base connection of the first transistor element Q1 has an auxiliary voltage $U_b$ applied to it via the resistor element R3. The base connection and the collector connection of the first transistor element Q1 are shorted, so that only the base/emitter diode of the first transistor element Q1 is used. When a detection current $i_{D3}$ of greater than 0 A is present or a negative potential, brought about by the inductive load L1, on the drain connection D in comparison with the potential of the source connection S, connected to the ground connection, of the semiconductor switch element FET1, a voltage drop across the base/emitter diodes of the first and second transistor elements Q1, Q2, of 0.6 V, for example, is produced which has essentially the same magnitude or is symmetrical. In this case, the first and second transistor elements Q1, Q2 mirror the voltage drop $U_{D3}$ across the detection element D3 on the mirror resistor R2, so that in terms of magnitude the same voltage $|U_{diff}|=|U_{D3}|$ drop is produced on or across said R2. On the basis of these potential ratios, an evaluation current $i_{CQ2}$ is produced as an electrical evaluation signal on the collector connection of the second transistor element Q2. In this case, the evaluation current $i_{CQ2}$ is a current signal which has been amplified by the second transistor element Q2 and which is directly dependent on the detection element current $i_{D3}$, on the gain factor of the second transistor element Q2 and, in the case of recirculation, on the voltage across the detection element D3, $D_{D3}$. Terminal A picks up the evaluation current $i_{CQ2}$, with an actuation circuit—not shown—being connected to terminals A and B. Depending on the value of the evaluation current $i_{CQ2}$, this actuation circuit provides a potential on terminal B—in line with the example, on the basis of a defined current threshold being exceeded or undershot—, said potential turning on the semiconductor switch element or power driver FET1 in the event of the threshold being exceeded and otherwise leaving it turned off. The diode elements D1 and D2 decouple the first and second transistor elements Q1, Q2 from the semiconductor switch element FET1 in the manner shown. The transistor elements Q1 and Q2 are of the same design, for reasons of symmetry, in line with the example.

The current threshold value, which the evaluation current $i_{CQ2}$ needs to be above or below in order for the semiconductor switch element FET1 to be turned on by the actuation circuit, is substantially dependent on the resistance value of the mirror resistor R2. To ascertain or measure the detection element current, account is taken, by way of example, of the value of the evaluation current $i_{CQ2}$, at least one piece of information about the current/voltage characteristic or the gain factor of the second transistor element Q2, and at least one piece of information about the current/voltage characteristic of the detection element.

FIG. 4 shows an exemplary electronic circuit device which comprises an actuation circuit 1, based on the circuit device illustrated in FIG. 3. In this case, the actuation circuit 1 comprises a hold circuit 2 and a reset circuit 3. The second transistor element Q2 drives the evaluation current $i_{CQ2}$, which is dependent on the detection element current $i_{D3}$, on the gain factor of Q2 and also on the voltage drop $U_{diff}$ across the mirror resistor R2. If the evaluation current $i_{CQ2}$ or detection element current $I_{D3}$ exceeds a defined value, the actuation circuit 1 prompts active freewheeling through semiconductor switch element FET1 by virtue of the evaluation current $i_{CQ2}$ or the potential which has been set thereby on the control connection of the transistor element Q4 prompting the transistor element Q4 to be turned on, and hence the auxiliary voltage Ub or Ub being applied on the basis of R5 to the gate connection of the semiconductor switch element FET1 and turning it on. This potential also turns on the transistor element Q5, which in turn ensures a defined minimum potential on the control connection or base connection of Q4, which holds the turning-on of FET1, regardless of the evaluation current $i_{CQ2}$. This hold circuit 2 with transistor elements Q4 and Q5 can be reset or "released" or "erased" by the reset circuit 3. This happens at least at the end of the recirculation phase or at the start of the switch-on phase of the PWM by virtue of the transistor element Q3 of the reset circuit 3 being actuated by a PWM switch-on signal U_rect—said signal U_rect being a square-wave signal from the PWM regulation, in line with the example—and then putting the semiconductor switch element FET1 into the off state shortly before or directly at the start of the switch-on phase by applying a ground potential to the gate connection of said semiconductor switch element.

The evaluation current $i_{CQ2}$ can alternatively be evaluated for the purpose of analog current estimation or current measurement, for example, or else as purely digital current detection. The circuit device shown in FIG. 4 shows an actuation circuit 1 which, in line with the example, is in the form of a digital current evaluation element using an RS-type flipflop, which is preferably of discrete design, with transistor elements Q3, Q4 and Q5.

Figure 5:
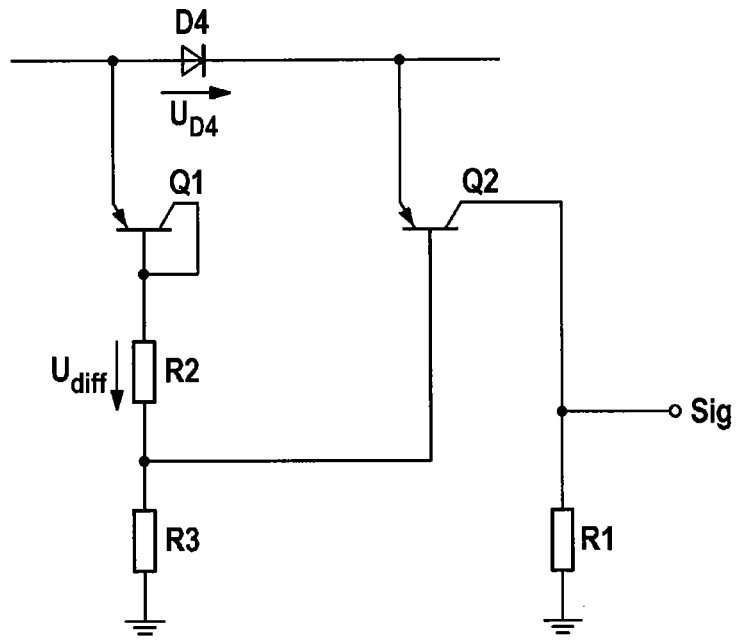
FIGS. 5 and 6 show two exemplary circuit devices with a polarity reversal protection diode as detection element.
Figure 6:
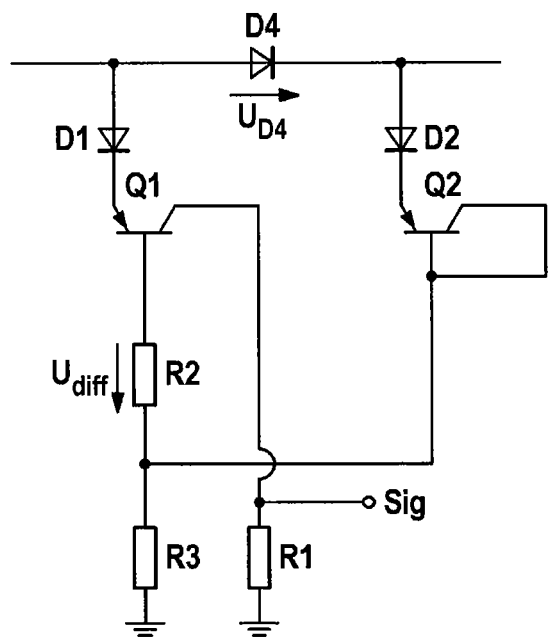

FIGS. 5 and 6 show two exemplary embodiments of circuit devices in which the detection element D4 is respectively in the form of a polarity reversal protection diode. The inputs of said polarity reversal protection diode D4 are connected to the emitter connection of the first transistor element Q1 and to the emitter connection of the second transistor element Q2, the base connections of which are connected to one another via mirror resistor R2, across which, when there is a voltage $U_{D4}$ across the polarity reversal protection diode D4 in the forward direction of the latter, there is a voltage drop $U_{diff}$ of the same magnitude. In FIG. 5, the second transistor element Q2 drives a collector current as an evaluation current, which is provided at the terminal Sig. In FIG. 6, the collector of the first transistor element Q1 drives said evaluation current. The evaluation current picked up by the terminal Sig is taken into account, in line with the example, in an evaluation circuit—not shown—for the purpose of ascertaining the detection element current flowing through the detection element or for the purpose of ascertaining the temperature in the detection element. In this case, the component properties of the polarity reversal protection diode D4 and of the transistor element Q1 or Q2 which drives the evaluation current are also taken into account. For the purpose of ascertaining the temperature, there should be at least one piece of information about the current, for example, and vice versa.

Figure 7:
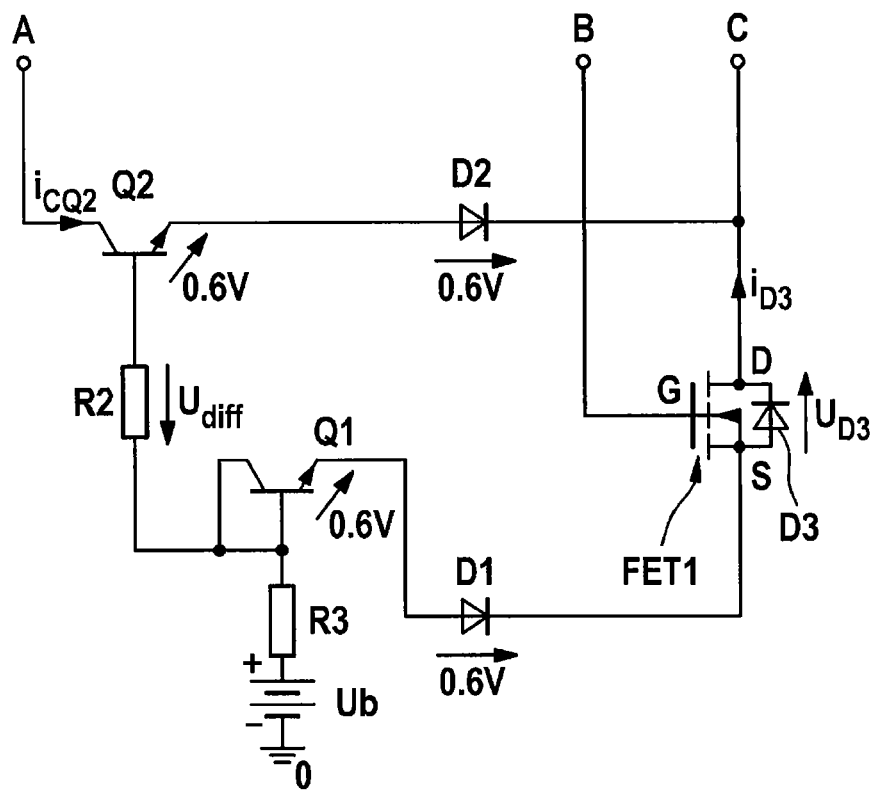
FIG. 7 shows an exemplary circuit device for current measurement and/or overcurrent identification for an essentially steadily flowing detection element current.

FIG. 7 shows an exemplary circuit device in which the semiconductor switch element FET1 and the detection element D3 form a polarity reversal protection element and the detection element current $i_{D3}$ or the current through FET1 is in the form of an essentially permanent compensating current. The circuit arrangement in line with the example, which is incidentally designed in line with the circuit device shown in FIG. 3, is used to measure the current through the detection element D3 and/or to perform overcurrent identification or short-circuit current identification.

The invention claimed is:

1. An electronic circuit device for sensing a detection element current, the electronic circuit device including:
   a detection element including one of a freewheeling diode and a bulk diode of a field effect transistor (FET) which is arranged in a common circuit mesh with an inductive load;
   a first transistor element;
   a second transistor element;
   wherein a first connection of the detection element is connected to the first transistor element and a second connection of the detection element is connected to the second transistor element,
   wherein respective base connections of the first and second transistor elements are connected to one another directly or indirectly, and
   wherein the second transistor element provides an electrical evaluation signal which is directly or indirectly dependent at least on one of the detection element current flowing through the detection element and a detection element temperature of the detection element.

2. The electronic circuit device of claim 1, wherein the detection element further comprises a semiconductor component.

3. The electronic circuit device of claim 1, wherein said inductive load further comprises a valve coil and/or a motor.

4. The electronic circuit device of claim 1, wherein the first and second transistor elements each have their emitter connection connected to the detection element, and the electrical evaluation signal comprises an evaluation current, the amperage of which is obtained at least from a portion of the detection element current which is amplified by the second transistor element.

5. An electronic circuit device for sensing a detection element current through a detection element and/or a temperature in said detection element,
   wherein a first connection of the detection element is connected to a first transistor element and a second connection of the detection element is connected to a second transistor element,
   wherein the base connections of the first and second transistor elements are connected to one another directly or indirectly and the second transistor element provides and/or modulates an electrical evaluation signal, the signal value of which is directly or indirectly dependent at least on the detection element current and/or the temperature in the detection element, and
   wherein a voltage drop across the detection element is mirrored on a mirror resistor by means of the first and second transistor elements, so that said mirror resistor has essentially the same voltage magnitude across it as the detection element.

6. The electronic circuit device of claim 1, wherein the first and second transistor elements are each connected to the detection element by means of a diode element for decoupling, wherein said diode elements are in blocking form in the direction from the detection element to the first and second transistor elements.

7. The electronic circuit device of claim 6, wherein the diode elements are each in the form of a diode or in the form of a diode path of a transistor element, wherein the diode elements are thermally coupled to one another.

8. The electronic circuit device of claim 1, wherein the detection element is in the form of a semiconductor switch element or is part of a semiconductor switch element in the form of a driver element of a recirculation path in an electronic, pulse-width-modulated valve actuation circuit.

9. The electronic circuit device of claim 8, wherein the evaluation signal is supplied to an actuation circuit which actuates the semiconductor switch element.

10. The electronic circuit device of claim 9, wherein the actuation circuit comprises a flipflop.

11. The electronic circuit device of claim 9 wherein the actuation circuit comprises an RS-type flipflop.

12. The electronic circuit device of claim 9, wherein the actuation circuit comprises a hold circuit and a reset circuit.

13. The electronic circuit device of claim 12, wherein the actuation circuit is actuated on the basis of PWM regulation of a PWM switch-on signal (U_rect) and/or a PWM switch-off signal, wherein the reset circuit is actuated by the PWM switch-on signal (U_rect), which terminates a hold state of the hold circuit.

14. The electronic circuit device of claim 1, wherein the inductive load is actuated via a current regulator, wherein a load current is lowered to a voltage potential below the supply voltage by means of a step-down controller.

15. The electronic circuit device of claim 1, wherein the first and second transistor elements are coupled to one another thermally.

16. A method for current sensing in an electronic circuit device according to claim 1, comprising:
   making available in an electronic control unit and/or in the circuit device a first piece of information about the temperature in the detection element and at least one second piece of information about the current/voltage characteristic of the detection element; and
   using the evaluation signal and at least the first and second pieces of information to ascertain the detection element current, directly or indirectly.

17. A method for temperature sensing in an electronic circuit device as claimed in claim 1, comprising
   making available in an electronic control unit and/or in the circuit device, a first piece of information about the detection element current through the detection element and at least one second piece of information about the current/voltage characteristic of the detection element; and
   using the evaluation signal and at least the first and second pieces of information to ascertain the temperature in the detection element, directly or indirectly.

18. The use of the electronic circuit device of claim 1 in a motor vehicle electronic brake controller or a chassis controller or a controller for active or passive safety systems or in a combination of these controllers.

* * * * *